(12) United States Patent
Ramamurthy et al.

(10) Patent No.: US 9,799,393 B1
(45) Date of Patent: Oct. 24, 2017

(54) METHODS, APPARATUS AND SYSTEM FOR PROVIDING NMOS-ONLY MEMORY CELLS

(71) Applicant: GLOBALFOUNDRIES INC., Grand Cayman (KY)

(72) Inventors: Hema Ramamurthy, Austin, TX (US); Sanjay Parihar, Austin, TX (US); Jongsin Yun, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/169,342

(22) Filed: May 31, 2016

(51) Int. Cl.
*G11C 11/41* (2006.01)
*G11C 11/412* (2006.01)
*H01L 27/11* (2006.01)
*G11C 11/419* (2006.01)
*H01L 27/12* (2006.01)

(52) U.S. Cl.
CPC .......... *G11C 11/412* (2013.01); *G11C 11/419* (2013.01); *H01L 27/1104* (2013.01); *H01L 27/1112* (2013.01); *H01L 27/1203* (2013.01)

(58) Field of Classification Search
CPC ...... G11C 11/41; G11C 11/412; G11C 11/419
USPC ............................................. 365/154, 189.04
See application file for complete search history.

(56) References Cited

PUBLICATIONS

Asthana, 6T SRAM performance and power gain using Double Gate MOS in 28nm FDSOI Technology, 2013, IEEE.*

* cited by examiner

*Primary Examiner* — Thao H Bui
*Assistant Examiner* — Alfredo Bermudez Lozada
(74) *Attorney, Agent, or Firm* — Williams Morgan, P.C.

(57) ABSTRACT

A memory device having a memory cell comprising NMOS only transistors. An SRAM bit cell comprises a first pass gate (PG) NMOS transistor coupled to a first bit line signal and a word line signal; a second PG NMOS transistor coupled to a second bit line signal and the word line signal; a first pull down (PD) NMOS transistor operatively coupled to the first PG NMOS transistor; a second PD NMOS transistor operatively coupled to the second PG NMOS transistor; a first pull up (PU) NMOS transistor operatively coupled to the first PD NMOS transistor; and a second PU NMOS transistor operatively coupled to the second PD NMOS transistor. Each of the back gates of the first and second PU NMOS transistors are coupled to a predetermined voltage signal for biasing the first and second PU NMOS transistors.

16 Claims, 7 Drawing Sheets

METHODS, APPARATUS AND SYSTEM FOR PROVIDING NMOS-ONLY MEMORY CELLS

FIELD OF THE INVENTION

Generally, the present disclosure relates to the manufacture of sophisticated semiconductor devices, and, more specifically, to providing NMOS only 6T SRAM cells, e.g., using FDSOI devices.

DESCRIPTION OF THE RELATED ART

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a plurality of process technologies are currently practiced, wherein, for many types of complex circuitry, including field effect transistors, CMOS technology is currently among the most promising approaches due to the superior characteristics in view of operating speed and/or power consumption and/or cost efficiency. During the fabrication of complex integrated circuits using, for instance, CMOS technology, millions of transistors, e.g., N-channel transistors and/or P-channel transistors, are formed on a substrate including a crystalline semiconductor layer. During fabrication of N-channel CMOS (NMOS) devices and/or P-channel CMOS (PMOS) devices, designers often control process steps to allow for increase current drive of those devices. For NMOS devices, the flow of electrons may be enhanced for increased current drive. For PMOS devices, the flow of "holes" may be enhanced for increased current drive. For example, a strained silicon layer is often formed to provide for improved transport of charge particles (i.e., electrons or holes).

There is a growing consensus in the industry that traditional methodology must be improved upon to provide smaller devices and devices that can operate at lower voltages. Currently, so-called bulk FETs are one of the more popular designs implemented in many devices. However, one of the problems associated with the typical bulk FET design includes the fact that these types of FETs can exhibit significantly reduced output resistance due to poor carrier confinement, leading to lower voltage gain and to low power efficiency. Further, due to the depletion regions in bulk FETs, current leakage may occur even when the FET is off. Current leakage may include drain leakage current, source leakage current, and well leakage current. The FET also tends to have a relatively high threshold voltage. Moreover, when supply voltage is reduced in order to decrease power consumption, the typical bulk FET design of tends to exhibit performance degradation.

Designers have suggested utilizing the so-called silicon-on-insulator (SOT) design to address some of the deficiencies and problems exhibited by the typical bulk FET design. SOI transistors are generally formed in thin layers of silicon that are isolated from the main substrate of a semiconductor wafer by using an electrical insulator, such silicon dioxide. The thin silicon layers may have thicknesses that range from several microns (typically for electrical power switching devices) down to less than 500 Å (typically for high-performance microprocessors). The isolation properties conferred by SOI designs provides for a reduction in the current leakage. SOI designs can provide other advantages such as faster operation of circuits and lower operating voltages. FIG. 1 illustrates a stylized depiction of a typical fully depleted FDSOI FET 100 formed on a semiconductor wafer.

The FDSOI FET 100 is formed on a silicon substrate 105. The FET 100 comprises a depletion region 150 formed by depositing silicon oxide. A gate 100 is formed on the substrate 105, surrounded by insulation 120 formed during the processing of the wafer, and is generally comprised of $HfO_2$.

A gate oxide layer 125 is formed over substrate 105. The gate 120 of the FET 120 is formed over the gate oxide layer 125. The FET 100 also comprises a source region 140 and the drain region 140, which are formed at the top of the substrate 105. If the substrate 105 is of N-type, the drain and source regions 130, 140 would be of P-type, and vice versa. Further, the FET 100 comprises a buried oxide (BOX) region 170 below the drain and source regions 130, 140.

In this configuration, instead of a large depletion region 160 of FIG. 1, the depletion region 150 is confined above the BOX region 170 and between the drain and source regions 130, 140. The BOX region 170 is formed below the source region 140, the drain region 130 and the depletion region 150. The position of the BOX region 170 prevents the formation of a large depletion region similar to the depletion region 160 of FIG. 1. Further, the depletion region 150, in this case, is fully depleted. If the drain and source regions 130, 140 are of P-type, the depletion region 150 would be an N-type depleted region, and vice versa.

Currently, FDSOI devices are used to form memory cells, such as static random access memory (SRAM) cells. FIG. 2 illustrates stylized depiction of a typical SRAM memory cell 200. SRAMs retain their stored data as long as they are supplied power. Unlike dynamic RAM (DRAM), which requires periodic "refresh" power cycles, SRAMs do not require refresh cycles. Further SRAMs are in contrast to non-volatile memory (e.g., flash memory) that continue to hold information despite losing power. The random access term of SRAM refers to the fact that an SRAM comprises a plurality of cells, wherein each cell may be accessed (write or read access) in any order, regardless of which SRAM cell was last accessed.

The cell 200 is a six transistor (6T) device, which includes: two access transistors 210 and 220; and four transistors (230, 240, 250, 260), which form two inverters. Two pairs of transistors form two inverters: a left inverter 231 from the transistor pair 230, 240; and right inverter 251 from the transistor pair 250, 260. Each of the transistors in the cell 200 is an FDSOI device, and each comprises a back gate, which may be used to perform biasing of the transistors of the cell 200. The output of each inverter is fed as an input to the other inverter, providing a feedback loop that stabilizes the inverters to their respective states.

The access transistors 210, 220 are coupled to bit-lines (BL) and word lines (WL). The bit lines and word lines are used to read from, and write to, the cell 200. In a standby mode, the word line is low, turning the access transistors 210, 220 to an off state. When the access transistors 210, 220 in an off state, the left inverter 231 is in a complementary state. In order to write information, data to be written is provided onto the bit line, and the inverse of the data state is provided onto the inverse bit line BLB. The access transistors 210, 220 are then turned on by setting the word line, WL to a high state. The bit lines are driven stronger, and therefore, the inverter transistors become asserted. This operation causes data to be written into the cell 200. When data is stored into the inverters 231, 251, the access transistors can be turned off, preserving the information in the inverters 231, 251. In order to perform a read function, the word line, WL is turned on. This activates the access transistors 210, 220, while the data (bit) that is stored in the inverters 231, 251 is sensed.

The transistors 240, 260 can be viewed as a pull up circuit, denoted by the dashed lines 270. As shown in FIG. 2, the transistors 240, 260 in the box 270 are PMOS devices and are pulled up to Vdd. All other transistors in the cell 200 are NMOS transistors. The PMOS transistors 240, 260 function as resistive loads for the pull up circuit 270.

Among the problems with the state of the art usage of PMOS transistors 240, 260 in the pull up circuit 270 include the fact that PMOS devices generally have the largest variations because they are the smallest devices in the cell 200. Further, since the PMOS transistors 240, 260 are surrounded by NMOS transistors in the cell 200, the control of the voltage threshold of the PMOS devices are different from the control of the threshold voltages of the NMOS transistors, causing further complications in setting up voltage thresholds. Further, a different processing mask has to be used to form the PMOS transistors 240, 260, as compared to forming NMOS transistors.

Some designers have attempted to address this issue by replacing the PMOS transistors 240, 260 in the pull up circuit 270 with resistive loads. FIG. 3 illustrates a stylized depiction of a typical SRAM circuit that includes resistive loads for a pull up circuit. FIG. 3 illustrates a 4T SRAM cell 300. The cell 300 includes a pullup circuit 370 that comprises resistive loads, instead for PMOS pullup transistors. The pullup circuit 370 comprises a $1^{st}$ resistive load 340 and a $2^{nd}$ resistive load 360.

The 4T cell 300 comprises two access transistors 310 and 320 and two transistors (230, 250) that respectively form two inverters with the $1^{st}$ and $2^{nd}$ resistive loads 340, 360. The transistor 340 and the $1^{st}$ resistive load 340 form a left inverter 331, and the transistor 350 and the $2^{nd}$ resistive load 360 a right inverter 351. The output of each inverter is fed as an input to the other inverter, providing a feedback loop that stabilizes the inverters to their respective states.

The access transistors 310, 320 are coupled to bit-lines (BL, BLB) and word lines (WL). The bit lines and word lines are used to read from, and write to, the cell 300. In a standby mode, the word line is low, turning the access transistors 310, 320 to an off state. When the access transistors 310, 320 in an off state, the left inverter 331 is in a complementary state. In order to write information, data to be written in provided onto the bit line and the inverse of the data state is provided in the inverse bit line BLB. The access transistors 310, 320 are then turned on by setting the word line, WL to a high state. The bit lines are driven stronger, therefore, the inverter transistors are asserted and the resistive loads 340 and 350 are driven. This operation causes data (bit) to be written into the cell 300. When data is stored into the inverters 331, 351, the access transistors can be turned off, preserving the information in the inverters 331, 351. In order to perform a read function, the word line, WL is turned on. This activates the access transistor, while the data that is stored in the inverters 331, 351 is sensed.

This arrangement avoids the PMOS issues described above in cell 200. However, the use of the $1^{st}$ and $2^{nd}$ resistive loads 340, 360 can cause other problems. These problems include the fact that resistive loads are hard to control. Essentially, the resistive loads have to be hard-designed in with a constant load, eliminating flexibility of load control. Process variations may require some adjustments to the resistive load, but the hard-designed nature of using the $1^{st}$ and $2^{nd}$ resistive loads 340, 360 make this task very difficult.

Further, poly-resistor devices are generally used for forming the $1^{st}$ and $2^{nd}$ resistive loads 340, 360. This approach causes usage of large area on the die. Further, using resistive loads in the cell 300 limits the ability to perform timing adjustment, which may been available if transistors were used in place of the $1^{st}$ and $2^{nd}$ resistive loads 340, 360.

Accordingly, both of the prior art approaches present various problems in forming SRAM cells. The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to at least one method, apparatus and system disclosed involves a memory device having a memory cell comprising NMOS only transistors. An SRAM bit cell comprises a first pass gate (PG) NMOS transistor coupled to a first bit line signal and a word line signal; a second PG NMOS transistor coupled to a second bit line signal and the word line signal; a first pull down (PD) NMOS transistor operatively coupled to the first PG NMOS transistor; a second PD NMOS transistor operatively coupled to the second PG NMOS transistor; a first pull up (PU) NMOS transistor operatively coupled to the first PD NMOS transistor; and a second PU NMOS transistor operatively coupled to the second PD NMOS transistor. Each of the back gates of the first and second PU NMOS transistors are coupled to a predetermined voltage signal for biasing the first and second PU NMOS transistors.

BRIEF DESCRIPTION OF THE DRAWINGS

The disclosure may be understood by reference to the following description taken in conjunction with the accompanying drawings, in which like reference numerals identify like elements, and in which.

Figure 1:
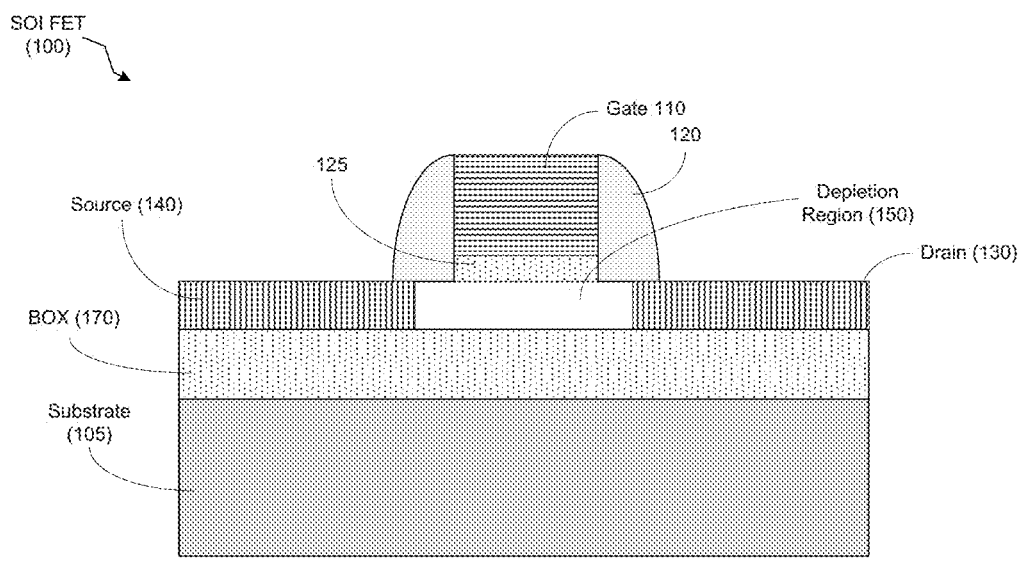
FIG. 1 illustrates a stylized depiction of a typical bulk FET formed on a semiconductor wafer.
Figure 2:
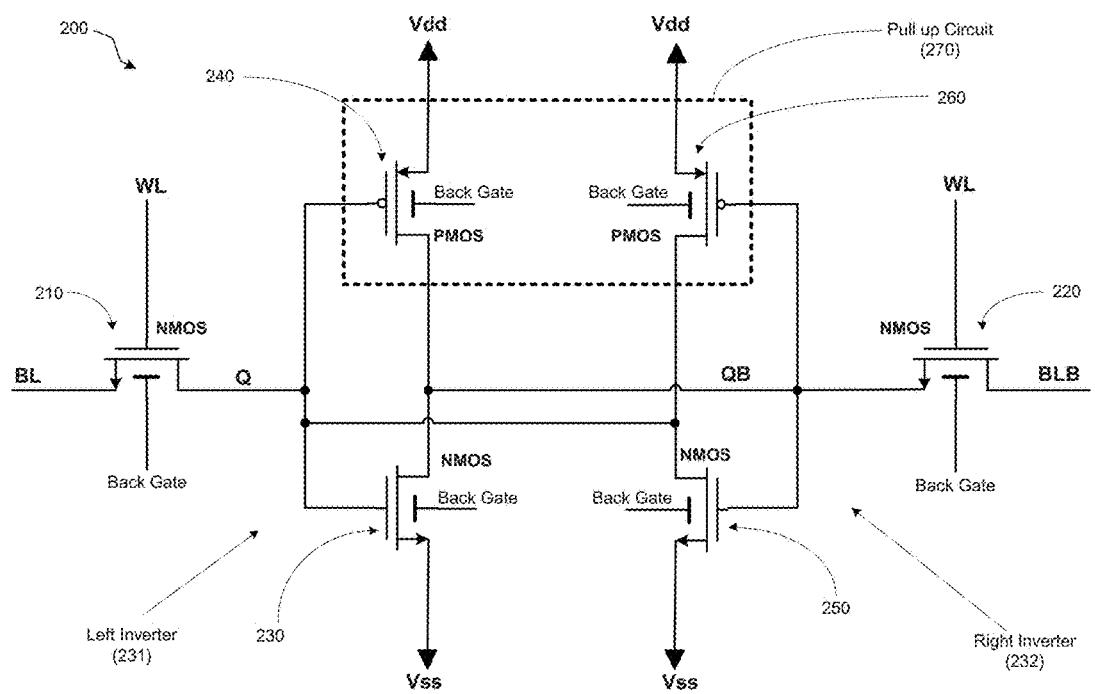
FIG. 2 illustrates stylized depiction of a typical SRAM memory cell.
Figure 3:
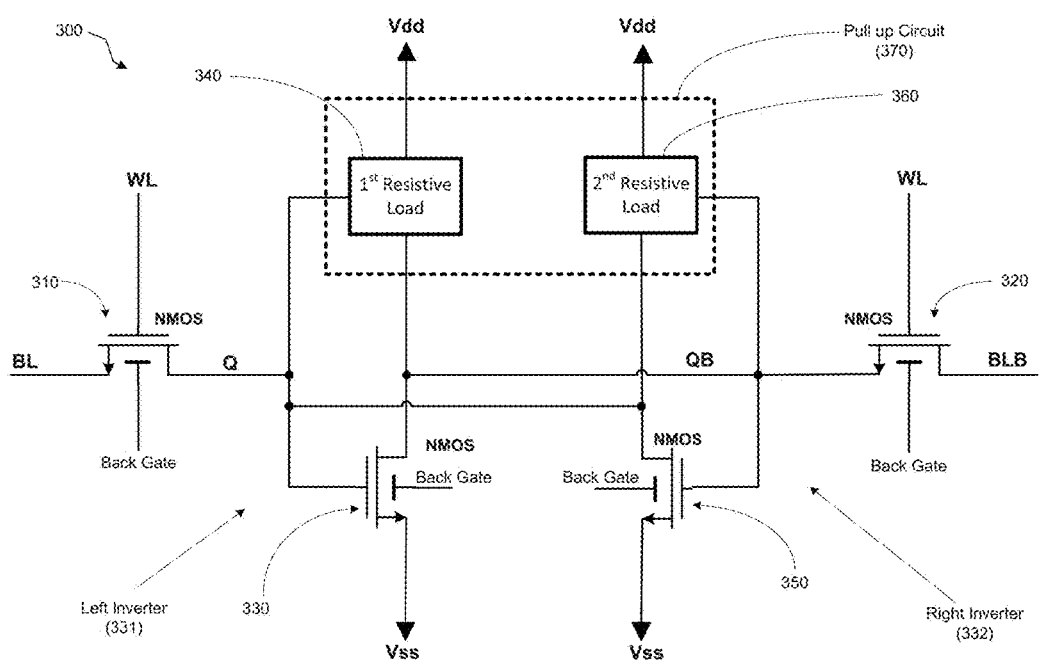
FIG. 3 illustrates a stylized depiction of a typical SRAM circuit that includes resistive loads for a pull up circuit.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for fabricating memory cells having same-type CMOS transistors, such as N-type, six transistor (6T) memory cells for a memory device, e.g., SRAM devices having FDSOI devices. Embodiments herein provide for fabricating pullup (PU) transistors in a similar manner as the fabrication of the pull-down (PD) and pass-gate (PG) transistors of a memory cell. For example, if the PD and PG transistors are fabricated as NMOS devices, the PU transistors are also fabricated as NMOS devices in a memory cell. Therefore, in embodiments herein, in a 6T SRAM cell, all six transistors may be NMOS transistors.

Embodiments herein provide for using the separate back gate biasing capability of FDSOI devices to employ differential biasing of the PD, PG, and PU transistors by either forward biasing or reverse biasing the FDSOI devices. Embodiments herein provide for using back plane biasing to adjust the threshold voltages of NMOS pullup transistors in a different manner as the biasing of the PD and PG transistors in a memory cell. The resistive NMOS load implementation for the PU transistors using back gate biasing provides for a tunable bit cell. The tunable bit cell may be tuned to a predetermined level of cell current, a predetermined level of static noise margin, and/or a predetermined level of write margin. In some embodiment, the bit cell may be tuned to provide a predetermined balance between the cell current, static noise margin, and the write margin.

Using the same-type transistors (e.g., using all NMOS transistors) for PD, PG, and PU devices, reduced variation and increased control of pull-up characteristics relative to the PG and PD devices may be achieved. Further, work function material for the PD, PG, and PU devices in a bit cell reduces or substantially eliminates variations of P-type and N-type gate stacks. Accordingly, having a single well-type (i.e., either P-type of N-type) and related implants for the back gates of the SDSOI devices being of a single material may make device fabrication more efficient, while reducing the number of implant layers required for fabrication. For example, embodiments herein allow for a single P-well type material and a single type of source/drain (S/D) implant layer to be used with to fabricate a 6T SRAM memory cell.

Embodiments herein allow for eliminating the need for two different types of transistors in an SRAM bit cell, which can lead to a more efficient process for fabricating bit cells. Using embodiment herein, the number of masks required for fabricating SRAM device is reduced. Further, using back gate biasing and/or source supply adjustment, increased control of the load resistance.

Although for ease of illustration, embodiments and drawings herein are described as having NMOS-type only memory cells, those skilled in the art having benefit of the present disclosure would appreciate that the principles provided herein also may be also applied to PMOS-type only memory cells with certain modifications (e.g., changing the polarity of the word line and bit line signals, changes to voltage sources, etc.). These modifications would be known to those skilled in the art having benefit of the present disclosure.

Figure 4:
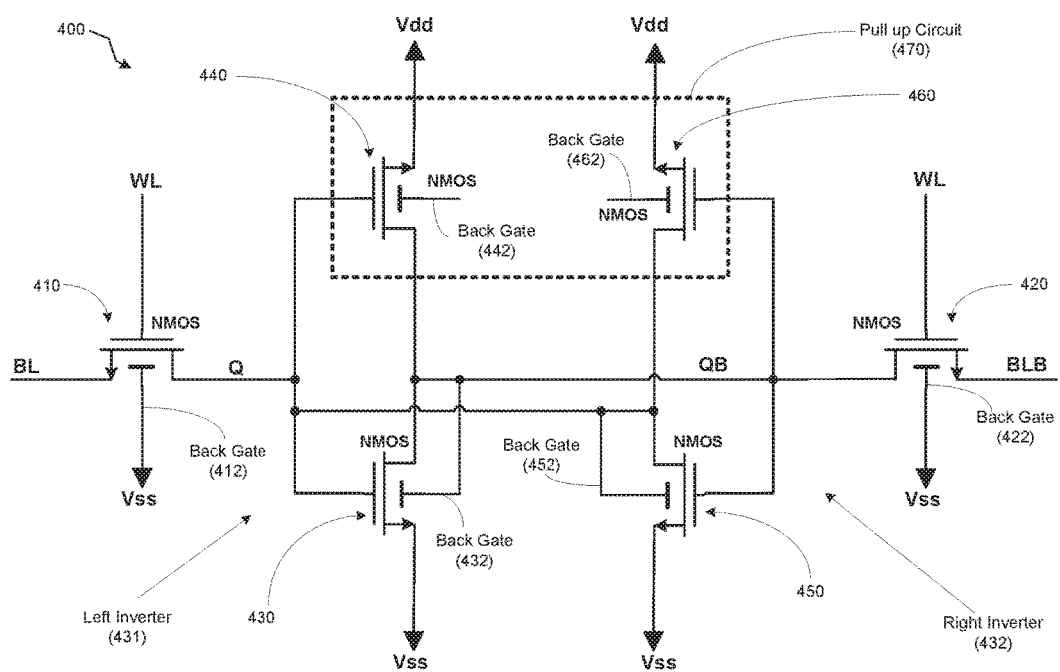
FIG. 4 illustrates a stylized depiction of a memory cell, in accordance with a first embodiment herein.
Figure 5:
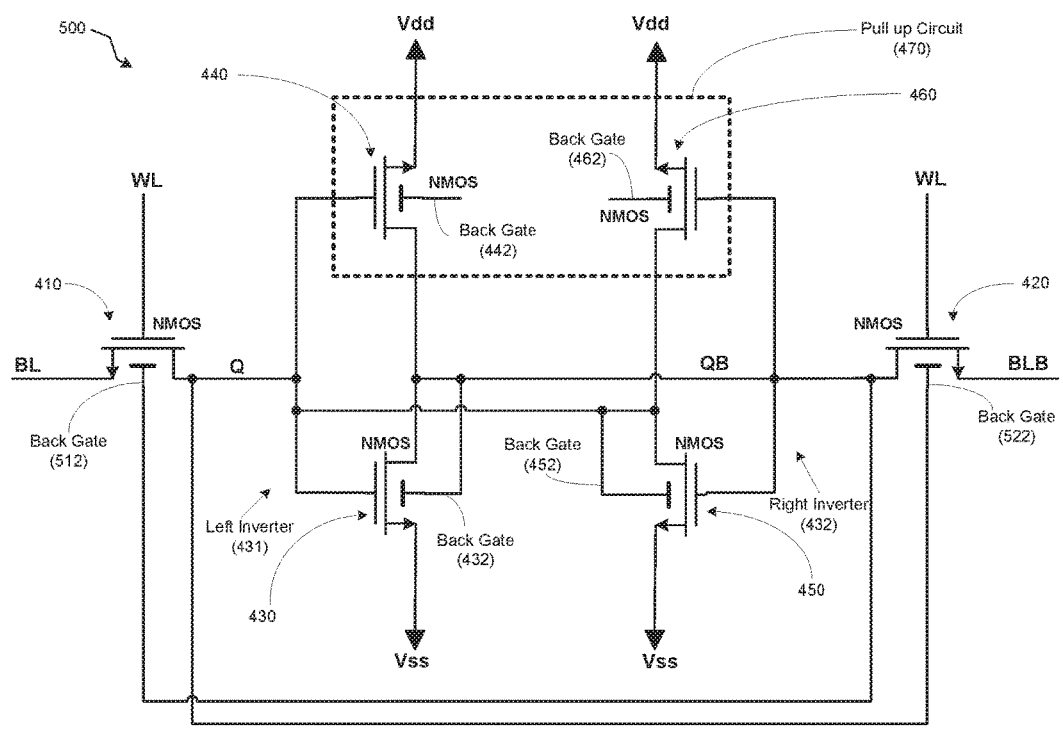
FIG. 5 illustrates a stylized depiction of a memory cell, in accordance with a second embodiment herein.
Figure 6:
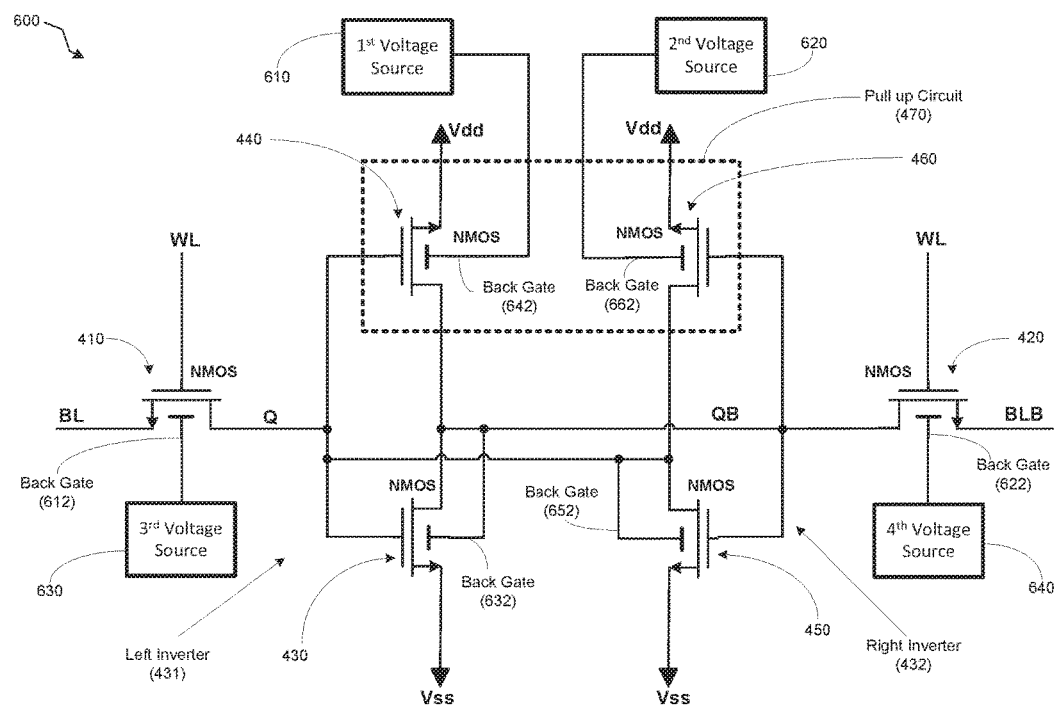
FIG. 6 illustrates a stylized depiction of a memory cell, in accordance with a third embodiment herein.

Turning now to FIG. 4, a stylized depiction of a memory cell, in accordance with a first embodiment herein, is illustrated. FIG. 4 shows a memory cell 400 comprising FDSOI (e.g., 22FDSOI) transistors. Although FIGS. 4-6 are illustrated as having FDSOI devices, those skilled in the art having benefit of the present disclosure would appreciate that the principles provided herein also apply to devices with other types of transistors.

The cell 400 is a six CMOS transistor (6T) device and comprises two access transistors 410 and 420 that as the pass gate (PG) transistors. Four of the transistors (430, 440, 450, 460) of the cell 400 form two inverters. Two pairs of transistors form two inverters: a left inverter 431 from the transistor pair 430, 440; and right inverter 451 from the transistor pair 450, 460. Each of the transistors in the cell 400 is an FDSOI device, and each comprises a back gate, which may be used to perform biasing of the transistors of the cell 400. The output of each inverter is fed as an input to the other inverter, providing a feedback loop that stabilizes the inverters to their respective states. The transistors 430 and 450 are the pull down (PD) transistors, and the transistors 440 and 460 are pull up transistors. The storage nodes Q and QB hold the bit stored in the cell 400.

The access transistors 410, 420 are respectively coupled to bit-lines BL and BLB and a word line (WL). The bit lines and word lines are used to read from, and write to, the cell 400. In a standby mode, the word line is low, turning the access transistors 410, 420 to an off state. When the access transistors 410, 420 in an off state, the left inverter 431 is in a complementary state.

In order to write information, data to be written in provided onto the bit line and the inverse of the data state is provided in the inverse bit line BLB. The access transistors

410, 420 are then turned on by setting the word line, WL to a high state. The bit lines are driven stronger, therefore, the inverter transistors are asserted. This operation causes the data to be written into the cell 400. When the data is stored into the inverters 431, 451, the access transistors can be turned off, preserving the information in the inverters 431, 451. In order to perform a read function, the word line, WL is turned on. This activates the access transistor, while the data stored in the inverters 431, 451 are sensed.

As shown in FIG. 4, the PG transistors 410, 420 and the PD transistors 430, 450 are NMOS transistors. The PU transistors 440, 460 collectively can be viewed as a pull up circuit, denoted by the dashed lines 470. As shown in FIG. 4, the transistors 440, 460 in the box 470 are NMOS devices and are pulled up to Vdd. Therefore, all six transistors in the cell 400 are NMOS transistors. The NMOS transistors 440, 460 function as resistive loads for the pull up circuit 470.

In one embodiment, the back gate 432 of transistor 430 is coupled to the front gate of the opposite PD transistor 450, i.e., to the QB node. Likewise, the back gate 452 of transistor 450 is coupled to the front gate of the opposite PD transistor 430, i.e., to the Q node. This feedback enhances data retention on the Q/QB nodes. Further, the back gate 412 of the PG transistor 410 and the back gate 422 of the PG transistor 420 are coupled to Vss, thereby providing a single P-well implementation. Moreover, the back gate 442 of the PU transistor and the back gate 462 of the PU transistor 460 may also be coupled to Vss.

In this manner, all of the transistors are NMOS devices, providing for a more efficient and simple implementation. Utilizing the signal gate type material of the cell 400 provides for substantially eliminating the differences in the P-gate work function and the N-gate work function, thereby reducing process variations. This also provides for a reduction in the number of masks required for fabricating SRAM cells. Further, as described below, increased control of load resistance for the pull up circuit 470 may be achieved by utilizing back gate bias.

Turning now to FIG. 5, a stylized depiction of a memory cell, in accordance with a second embodiment herein, is illustrated. FIG. 5 shows a memory cell 500 comprising FDSOI (e.g., 22FDSOI) transistors, similar to the cell of FIG. 4. However, in the cell 500, a back gate 532 of PD transistor 430 and a back gate 552 of PD transistor 550 are biased differently.

In one embodiment, the back gate 512 of PG transistor 410 is coupled to the front gate of the PD transistor 450, i.e., to the QB node. Further, the back gate 522 of PG transistor 420 is coupled to the front gate of the PD transistor 430, i.e., to the Q node. This configuration may provide an improvement in the write margins of the cell 500. Further, this configuration may reduce current leakage on the PG transistors 410, 420.

Turning now to FIG. 6, a stylized depiction of a memory cell, in accordance with a third embodiment herein, is illustrated. FIG. 6 shows a memory cell 500 comprising FDSOI (e.g., 22FDSOI) transistors, similar to the cell 400 of FIG. 4. However, in the cell 500, the back gate 632 of PD transistor 430 and the back gate 652 of PD transistor 550 are biased differently from cell 400 of FIG. 4.

In the cell 600, the back gate 642 of the PU transistor and the back gate 662 of the PU transistor 460 may be biased differently from the PG and PD transistors. Biasing the PU back gates 642, 662 provides for a tunable bit cell wherein a predetermined balance or tradeoff may be achieved between cell current, static noise margin, and write margins.

In one embodiment, the back gate control of the PU devices 440, 460 allows for biasing the back gates 642, 662 in order to provide a tunable leakage cell current, which is also a tradeoff between various factors, such as cell current, static noise margin, and write margins. Therefore, the cell current leakage may be adjusted by controlling the biasing of the back gates 642, 662. Further, the static noise margin (SNR) may be adjusted by controlling the biasing of the back gates 642, 662.

In one embodiment, separate voltage sources may be provided to separately bias one or more of the back gates of the transistors of the cell 600. In one embodiment, the back gate 642 of the PU device 440 may be biased using a $1^{st}$ voltage source 610. The back gate 642 of the PU device 460 may be biased using a $2^{nd}$ voltage source 620. The $1^{st}$ and $2^{nd}$ voltage sources 610, 620 may be configured to provide biasing of PU devices in the pull up circuit 470 to perform tunable leakage cell current control and/or SNM control. In an alternative embodiment, both of the back gates 642, 662 may be biased using a single voltage source (i.e., the $3^{rd}$ and $4^{th}$ voltage sources may be a single voltage source).

In some embodiments, the back gate 612 of the PG device 410 may be biased using a $3^{rd}$ voltage source 630 and the back gate 622 of the PG device 420 may be biased using a $4^{th}$ voltage source 640 (i.e., the $3^{rd}$ and $4^{th}$ voltage sources may be a single voltage source). In an alternative embodiment, both of the back gates 612, 622 may be biased using a single voltage source. The separate biasing of the PG and PU devices may provide for control and balance between cell current, static noise margin, and write margins to predetermined levels. The biasing of the back gates of FDSOI device provide for customizing performance characteristics (e.g., write margins, read margins, tenability of current leakage, drive strength, etc.).

Figure 7:
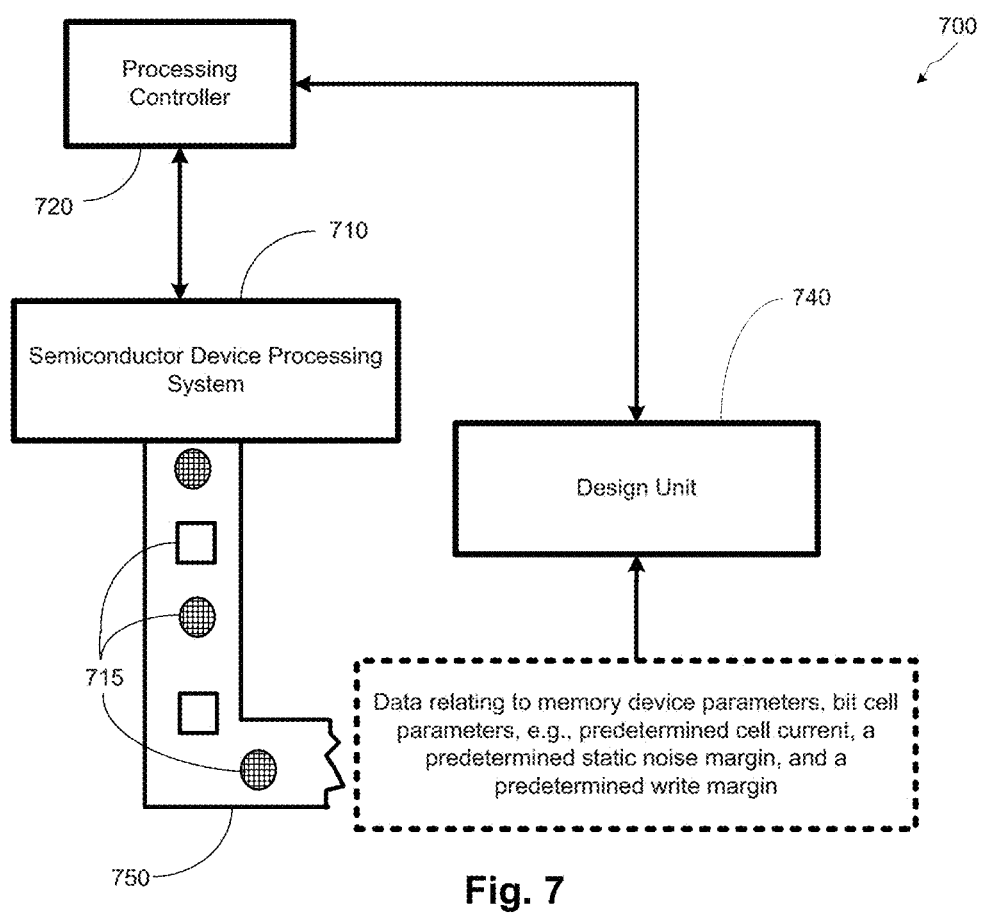
FIG. 7 illustrates a stylized depiction of a system for fabricating memory cells having same-type transistors only SRAM cell, in accordance with some embodiments herein.

Turning now to FIG. 7, a stylized depiction of a system for fabricating memory cells having same-type transistors, in accordance with some embodiments, is illustrated. More specifically, the system 710 may be configured to fabricate SRAM memory cells having same-type transistors (e.g., NMOS), including PU transistors. The semiconductor device processing system 710 may comprise various processing stations, such as etch process stations, photolithography process stations, CMP process stations, etc. One or more of the processing steps performed by the processing system 710 may be controlled by the processing controller 720. The processing controller 720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 710 may produce integrated circuits on a medium, such as silicon wafers (e.g., circuits exemplified in FIGS. 4-6). The production of integrated circuits by the device processing system 710 may be based upon the circuit designs provided by the integrated circuits design unit 740. The processing system 710 may provide processed integrated circuits/devices 715 on a transport mechanism 750, such as a conveyor system. In some embodiments, the conveyor system may be sophisticated clean room transport systems that are capable of transporting semiconductor wafers. In one embodiment, the semiconductor device processing system 710 may comprise a plurality of processing steps, e.g., the $1^{st}$ process step, the $2^{nd}$ process set, etc., as described above.

In some embodiments, the items labeled "715" may represent individual wafers, and in other embodiments, the items 715 may represent a group of semiconductor wafers, e.g., a "lot" of semiconductor wafers. The integrated circuit or device 715 may be a transistor, a capacitor, a resistor, a memory cell, a processor, and/or the like. In one embodiment, the device 715 is a transistor and the dielectric layer is a gate insulation layer for the transistor.

The integrated circuit design unit 740 of the system 700 is capable of providing a memory device design that may be manufactured by the semiconductor processing system 710. The design unit 740 may receive data relating to the design specifications for the integrated circuits to be fabricated, including parameters relating to transistors having back gate and front gate for transistors, data relating to memory device parameters, bit cell parameters, e.g., predetermined cell current, a predetermined static noise margin, and a predetermined write margin. The design unit 740 is capable of analyzing and performing design adjustments to provide, route, and specifications for biasing the back gates of the transistors of each cell. More particularly, the design unit 740 may receive data relating the specifications for forming transistors comprising back gate and front gates. Further, the design unit 740 may receive data relating to biasing voltage levels for biasing the back gates, operation voltage, threshold specifications, memory device specifications, predetermined cell currents, predetermined static noise margin, and/or predetermined write margin of memory devices portions (e.g., SRAM bit cells).

In other embodiments, the design unit 740 may perform an automated determination of area that require design adjustments to provide, route, and implement forward and/or reverse biasing voltages and timing adjustments, and automatically incorporate design adjustments into the device design. For example, once a designer or a user of the integrated circuit design unit 740 generates a design using a graphical user interface to communicate with the integrated circuit design unit 740, the unit 740 may perform automated modification of the design.

The system 700 may be capable of performing analysis and manufacturing of various products involving various technologies. For example, the system 700 may design and production data for manufacturing devices of CMOS technology, SRAM devices, Flash technology, BiCMOS technology, power devices, controllers, processors, RF circuits, and/or various other semiconductor technologies.

Although in some examples, circuits herein were described in terms of FD SOI devices for consistency and ease of illustration, those skilled in the art would appreciate that concepts described herein may also apply to other SOI devices (e.g., partially depleted (PD) SOI devices) and remain within the scope of embodiments herein. The concepts and embodiments described herein may apply to a plurality of types of VT families of devices, including but limited to, FD SOI LVT transistors, FD SOI SLVT transistors, FD SOI RVT transistor, FD SOI HVT transistors, or combination herein, and remain within the scope of the embodiments herein.

The system 1100 may be capable of manufacturing and testing various products that include transistors with active and inactive gates involving various technologies. For example, the system 1100 may provide for manufacturing and testing products relating to CMOS technology, BiCMOS technology, power devices, memory devices, processors, and/or various other types of integrated circuit devices.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
providing a first pass gate (PG) NMOS transistor coupled to a first bit line signal and a word line signal;
providing a second PG NMOS transistor coupled to a second bit line signal and said word line signal;
providing a first pull down (PD) NMOS transistor operatively coupled to said first PG NMOS transistor;
providing a second PD NMOS transistor operatively coupled to said second PG NMOS transistor;
providing a first pull up (PU) NMOS transistor operatively coupled to said first PD NMOS transistor;
providing a second PU NMOS transistor operatively coupled to said second PD NMOS transistor;
coupling each of the back gates of said first and second PU NMOS transistors to a predetermined voltage signal for biasing said first and second PU NMOS transistors to form a memory cell; and
at least one of (i) coupling a back gate of said first PD transistor to a front gate of said second PD transistor and coupling a back gate of said second PD transistor to a front gate of said first PD transistor, or (ii) coupling a back gate of said first PG transistor to a front gate of said second PD transistor and coupling a back gate of said second PG transistor to a front gate of said first PD transistor.

2. The method of claim 1, further comprising coupling said first and second PD NMOS transistors to said first and second PU NMOS transistors to form an inverter to store data.

3. The method of claim 1, wherein biasing said first and second PU NMOS transistors comprises biasing said first and second PU NMOS transistors for forming a NMOS resistive load circuit.

4. The method of claim 1, wherein biasing said first and second PU NMOS transistors comprises coupling said back gate of said first PU NMOS transistor to a first voltage source and coupling said back gate of said second PU NMOS transistor to a second voltage source.

5. The method of claim 1, further comprising biasing said first and second PU NMOS transistors comprises tuning said memory cell to have at least one of a predetermined cell current, a predetermined static noise margin, and a predetermined write margin.

6. The method of claim 1, further comprising biasing said first PG NMOS transistor by coupling a back gate of said first PG NMOS transistor to a third voltage source and biasing said second PG NMOS transistor by coupling a back gate of said second PG NMOS transistor to a fourth voltage source.

7. The method of claim 1, further comprising:
coupling said first and second PU transistors to a logic high voltage signal;
coupling said first and second PD transistors to a logic low voltage signal; and
coupling said first and second PG transistors to said logic low voltage signal.

8. A memory device, comprising:
an SRAM bit cell comprising:
a first pass gate (PG) NMOS transistor coupled to a first bit line signal and a word line signal;
a second PG NMOS transistor coupled to a second bit line signal and said word line signal;
a first pull down (PD) NMOS transistor operatively coupled to said first PG NMOS transistor;
a second PD NMOS transistor operatively coupled to said second PG NMOS transistor;
a first pull up (PU) NMOS transistor operatively coupled to said first PD NMOS transistor;
a second PU NMOS transistor operatively coupled to said second PD NMOS transistor; and
wherein each of the back gates of said first and second PU NMOS transistors are coupled to a predetermined voltage signal for biasing said first and second PU NMOS transistors, and
wherein a back gate of said first PG transistor is coupled to a front gate of said second PD transistor, and a back gate of said second PG transistor is coupled to a front gate of said first PD transistor.

9. The memory device of claim 8, wherein said first and second PD NMOS transistors are coupled with said first and second PU NMOS transistors to form an inverter to store data bit; and wherein said first type is at least one of an NMOS type or a PMOS type.

10. The memory device of claim 8, wherein said first and second PU NMOS transistors are configured to be biased for forming a NMOS resistive load circuit.

11. The memory device of claim 8, wherein said back gate of said first PU NMOS transistor is coupled to a first voltage source and said back gate of said second PU NMOS transistor is coupled to a second voltage source.

12. The memory device of claim 8, wherein said first PG NMOS transistor is configured to be biased by coupling a back gate of said first PG NMOS transistor to a third voltage source, and said second PG NMOS transistor is configured to be biased by coupling a back gate of said second PG NMOS transistor to a fourth voltage source.

13. The memory device of claim 8, wherein said SRAM bit cell is configured to be tuned by biasing for providing at least one of a predetermined cell current, a predetermined static noise margin, and a predetermined write margin.

14. The memory device of claim 8, wherein said first and second PD NMOS transistors, said first and second PG NMOS transistors, and said first and second PU NMOS transistors are least one of an FD SOI transistor, wherein said FD SOI transistor is at least one of an FD SOI LVT transistor, an FD SOI SLVT transistor, an FD SOI RVT transistor, or an FD SOI HVT transistor.

15. A system, comprising:
a semiconductor device processing system to process a semiconductor wafer for manufacturing a memory device, wherein semiconductor device processing system comprising:
a design unit configured to provide parameters for manufacturing said memory device, wherein said memory device comprising:
an SRAM bit cell comprising:
a first pass gate (PG) NMOS transistor coupled to a first bit line signal and a word line signal;
a second PG NMOS transistor coupled to a second bit line signal and said word line signal;
a first pull down (PD) NMOS transistor operatively coupled to said first PG NMOS transistor;
a second PD NMOS transistor operatively coupled to said second PG NMOS transistor;
a first pull up (PU) NMOS transistor operatively coupled to said first PD NMOS transistor;
a second PU NMOS transistor operatively coupled to said second PD NMOS transistor;
wherein each of the back gates of said first and second PU NMOS transistors are coupled to a predetermined voltage signal for biasing said first and second PU NMOS transistors, and
wherein a back gate of said first PG transistor is coupled to a front gate of said second PD transistor, and a back gate of said second PG transistor is coupled to a front gate of said first PD transistor; and
a processing controller operatively coupled to said semiconductor device processing system, said processing controller configured to control an operation of said semiconductor device processing system for manufacturing said memory device.

16. The system of claim 15, wherein said SRAM bit cell is configured to be tuned by biasing for providing at least one of a predetermined cell current, a predetermined static noise margin, and a predetermined write margin.

* * * * *